(12) United States Patent
Ramsey

(10) Patent No.: US 8,294,044 B2
(45) Date of Patent: Oct. 23, 2012

(54) ELECTROMAGNETIC ISOLATION CHAMBER WITH UNIMPEDED HAND ENTRY

(76) Inventor: John G. Ramsey, Pittsford, NY (US)

( * ) Notice: Subject to any disclaimer, the term of this patent is extended or adjusted under 35 U.S.C. 154(b) by 295 days.

(21) Appl. No.: 12/730,292

(22) Filed: Mar. 24, 2010

(65) Prior Publication Data

US 2011/0232956 A1    Sep. 29, 2011

(51) Int. Cl.
 *H05K 9/00* (2006.01)
(52) U.S. Cl. .................................. 174/382; 250/516.1
(58) Field of Classification Search .............. 174/380, 174/382; 324/750.27; 361/818; 250/516.1
See application file for complete search history.

(56) References Cited

U.S. PATENT DOCUMENTS

| | | | | |
|---|---|---|---|---|
| 3,883,749 | A * | 5/1975 | Whittaker et al. | 250/516.1 |
| 4,156,146 | A * | 5/1979 | Imai et al. | 250/516.1 |
| 5,099,135 | A * | 3/1992 | Gemmill | 250/516.1 |
| 5,310,517 | A * | 5/1994 | Dams et al. | 264/255 |
| 5,594,200 | A | 1/1997 | Ramsey | |
| 6,968,993 | B1 * | 11/2005 | Russell | 232/17 |
| 7,589,979 | B2 * | 9/2009 | Chang et al. | 361/818 |
| 7,767,990 | B2 * | 8/2010 | Cadwalader et al. | 250/519.1 |
| 8,071,892 | B2 * | 12/2011 | Leegate et al. | 174/380 |
| 2003/0057131 | A1 * | 3/2003 | Diaferia | 206/719 |
| 2003/0076011 | A1 * | 4/2003 | Brownfiel, Jr. | 312/1 |
| 2008/0060843 | A1 * | 3/2008 | Ginanneschi | 174/378 |
| 2009/0126088 | A1 * | 5/2009 | Yadav et al. | 2/457 |
| 2009/0146862 | A1 * | 6/2009 | Malone | 342/1 |
| 2009/0149141 | A1 * | 6/2009 | Mao et al. | 455/115.3 |

* cited by examiner

*Primary Examiner* — Hung Ngo
(74) *Attorney, Agent, or Firm* — Patent Technologies, LLC; Robert D. Gunderman, Jr.

(57) ABSTRACT

An Electronic Isolation Chamber With Unimpeded Hand Entry is disclosed. The somewhat "open" appearance of the Electromagnetic Isolation Chamber goes contrary to teachings in the art of RF shielding and enclosures. A sleeve through an aperture in the chamber is worn by an operator, and with the placement of an operator's arm there through, the electromagnetic shielding is completed and the volume contained within the chamber is electromagnetically isolated from the environment exterior to the chamber. This novel arrangement allows an operator to work with bare hands, thus providing more tactile interaction with a device under test and also reducing the tendency for shorting that is present when wearing conductive gloves. A shielded window and an interior light may be included to facilitate viewing of a device within the chamber during operation of the device. The chamber provides an inexpensive, fully shielded environment for the testing, tuning, adjusting, or repair of RF transmitting or receiving devices such as computers, wireless devices, cellular telephones, and the like.

18 Claims, 8 Drawing Sheets

ELECTROMAGNETIC ISOLATION CHAMBER WITH UNIMPEDED HAND ENTRY

BACKGROUND OF THE INVENTION

1. Field of the Invention

The present invention relates to electromagnetic isolation chambers, and more particularly, relates to an electromagnetic isolation chamber with unimpeded hand entry that allows for the use of bare hands inside the chamber.

2. Description of Related Art

Electromagnetic reception and transmission is an important function of many devices, for example, cellular telephones and email devices, notebook computer wireless modems, Global Positioning System receivers, wireless data devices, and the like. Similarly, many sensitive electronic devices may be susceptible to electromagnetic signals and need to be shielded from such signals when under test. Testing, tuning, and repair of such a device can require that the Device Under Test (DUT) be isolated from, ambient electromagnetic radiation. This is sometimes necessary to permit exposing a receiving device to an unambiguous test signal free from electromagnetic interference, or to obtain a corresponding clean signal from a transmitting device. Typically, a device to be tested is placed inside an electromagnetic isolation (EMI) chamber, sometimes also known as a Faraday cage, comprising a continuous shielded enclosure which prevents ingress or egress of electromagnetic radiation. Such a chamber may take the form of an entire room, known in the art as a "screen room" for its continuous screen shielding, wherein an operator testing a device may also be enclosed in the room with the device.

A screen room can be quite expensive and therefore may not be economically feasible for a small business. Likewise, a screen room can be quite large making it unsuitable for many test or operating environments. Smaller shielded enclosures, also known as shielded boxes, capable of housing a Device Under Test but not an operator, are disclosed, for example, in U.S. Pat. No. 4,884,171 to Maserang et al.; U.S. Pat. No. 5,136,119 to Leyland; U.S. Pat. No. 5,171,936 to Suzuki et al.; and U.S. Pat. No. 5,594,200 to Ramsey. Shielded windows to permit viewing of the device under test may be provided and are disclosed, for example, in the '171 patent to Maserang et al. and the '200 patent to Ramsey. Shielded boxes are less expensive and less consumptive of space than are screen rooms; but a serious shortcoming of many shielded boxes is a lack of provision for direct tactile interaction or manipulation of the Device Under Test by an operator during testing, measuring, inspecting or tuning. Known shielded boxes require that the device to be tested be placed in the box, the box then closed, and all communication with the device be done remotely via suitably RF shielded or filtered interfaces. This prohibits, for example, an operator's making adjustments to a Device Under Test or exercising a Device Under Test directly through its normal modes of operation during testing, and may require clumsy and time-consuming workarounds to such operation which may not be entirely representative of the device in actual use. Ramsey in U.S. Pat. No. 5,594,200 discloses an enclosure with shielded gloves to permit manipulation of the Device Under Test while still maintaining shielding effectiveness. The entire disclosure of which is incorporated herein by reference. However, in use, the operator's hands are severely impeded by wearing such shielded gloves, making operation and testing of the Device Under Test clumsy, time consuming, and difficult. Additionally, such RF shielding techniques generally require the use of electrically conductive material, thus making the operator's hands, when inserted into the shielded gloves, electrically conductive and subject to electrical short circuits if they touch current carrying conductors inside the enclosure. As an example, a bare electronic printed circuit board could easily become shorted if the shielded glove were to contact the circuit traces.

It is therefore an object of the present invention to provide an improved electromagnetic isolation chamber which allows direct tactile manipulation of a device within the chamber by an operator outside the chamber using bare hands. It is a further object of the present invention to provide an improved electromagnetic isolation chamber having improved lighting and viewing of a device under test within the chamber. It is another object of the present invention to provide a conductive sleeve for upgrading an existing electromagnetic isolation chamber. It is yet another object of the present invention to provide a conductive sleeve kit for upgrading an existing electromagnetic isolation chamber.

These and other objects of the present invention are described in the detailed specification, drawings and claims contained herein.

BRIEF SUMMARY OF THE INVENTION

An electromagnetic isolation chamber with unimpeded hand entry containing a volume of space electromagnetically isolated from the surrounding environment, comprising an enclosure surrounding said volume, said enclosure comprising electromagnetic shielding surrounding said volume and having an aperture there through and a conductive sleeve conductively open on both ends and conductively and shieldingly attached to said electromagnetic shielding and extending from said aperture, said conductive sleeve being deformable and of sufficient diameter to enclose and contact an operator's arm which may be inserted into said electromagnetic isolation chamber through said conductive sleeve and aperture so that continuity of electromagnetic isolation of said volume of space is maintained while the operator's arm is inserted through said sleeve.

The foregoing paragraph has been provided by way of introduction, and is not intended to limit the scope of the invention as described and claimed herein.

BRIEF DESCRIPTION OF THE DRAWINGS

The invention will be described by reference to the following drawings, in which like numerals refer to like elements, and in which.

Figure 1:
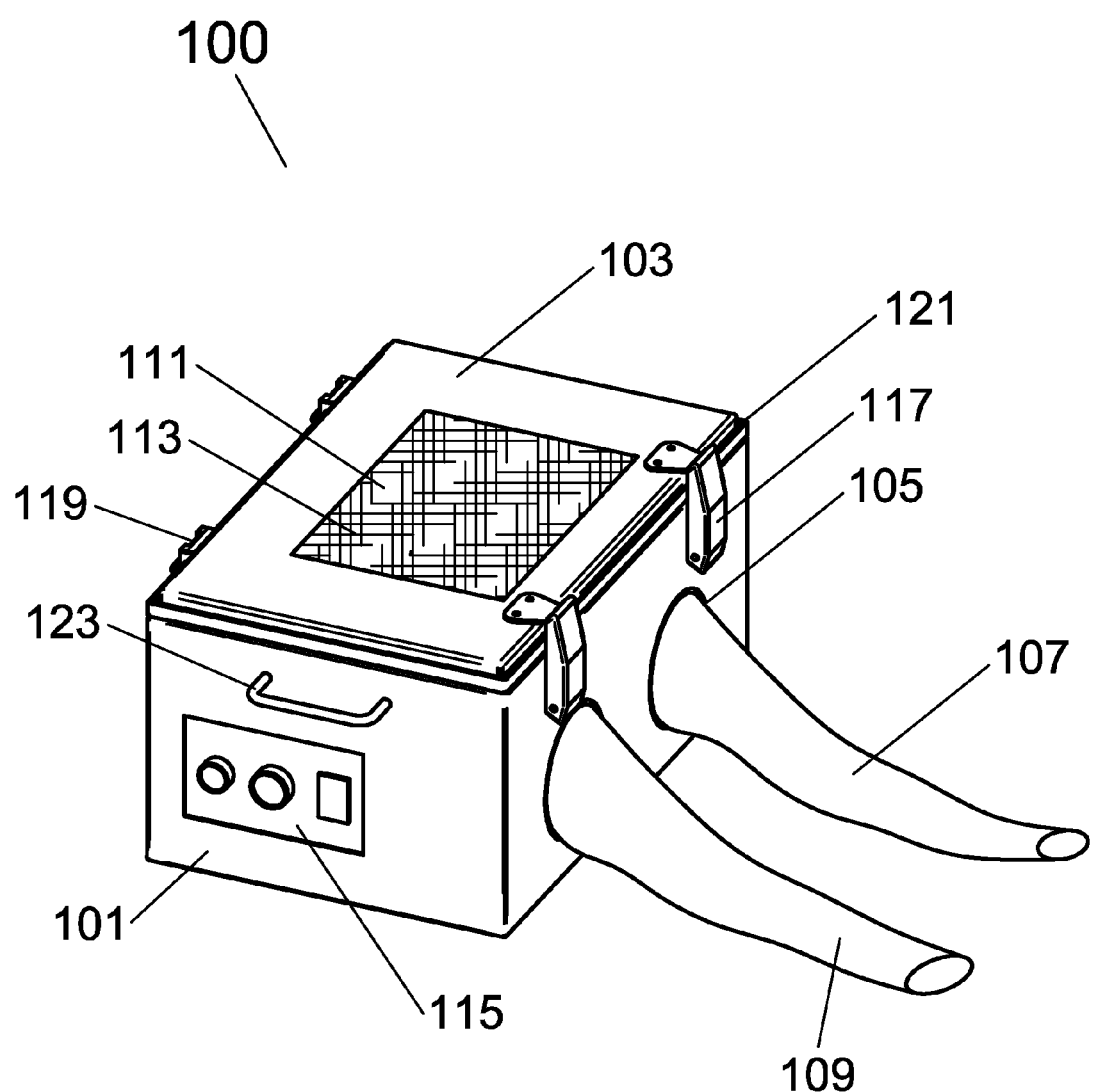
FIG. 1 is a closed perspective view of the Electromagnetic Isolation Chamber With Unimpeded Hand Entry.

The present invention will be described in connection with a preferred embodiment, however, it will be understood that there is no intent to limit the invention to the embodiment described. On the contrary, the intent is to cover all alternatives, modifications, and equivalents as may be included within the spirit and scope of the invention as defined by this specification, drawings, and claims contained herein.

DESCRIPTION OF THE PREFERRED EMBODIMENTS

For a general understanding of the present invention, reference is made to the drawings. In the drawings, like reference numerals have been used throughout to designate identical elements.

The Electromagnetic Isolation Chamber With Unimpeded Hand Entry comprises a shielded sleeved enclosure enclosing a volume which, during use, is fully shielded from electromagnetic radiation for handling of devices requiring electromagnetic isolation for testing, tuning, repair, and the like. The Electromagnetic Isolation Chamber With Unimpeded Hand Entry is capable of providing a signal reduction within the enclosure of about 80 db compared with ambient signal strength outside the structure. The Electromagnetic Isolation Chamber With Unimpeded Hand Entry opens for access, for example by having a top hinged from a base and secured by a latch, with shielding gasketing or similar material between the top and the base. The enclosure has at least one aperture to within the structure, to which a conductive sleeve is conductively and shieldingly attached to the shielding of the enclosure so that the sleeve and the operator's arm inside the sleeve create a radiofrequency barrier, making use of the known radio frequency attenuating effect of the human body. The operator's arm thus allows entry into the enclosure while maintaining shielding effectiveness. It is noted that the enclosure provides less than desirable shielding effect if the operator's arm is not inserted into the sleeve and if the arm is not in contact with the conductive sleeve.

In one embodiment, the conductive sleeve is formed from appropriately conductive material, such as a metalized polyester containing a stretch material such as Lycra®, spandex, or the like. Such a fabric having the ability to snugly conform to the operator's arm, allowing for conductive integrity. At radio frequencies, such conduction is mainly capacitive, so a low ohmic connection is not required, and therefore a fabric is suitable and further adds to the comfort of the operator while using the Electromagnetic Isolation Chamber With Unimpeded Hand Entry. Additionally, the conductive sleeve does not necessarily need to be elastic throughout its entirety. Other techniques of providing contact with the operator's arm may also be used, for example, elastic bands placed along the length of the sleeve, therefore providing contact to the operator's arm. Contact points and bands being determined in accordance with the amount of RF shielding required for a given application. Preferably, two apertures and conductive sleeves are provided, for the left and right hands, respectively, of an operator. By using an operator's arm inserted into the conductive sleeve, there is no need for the sleeve to be fully enclosed at its end like a glove. The operator's hand while using the electromagnetic isolation chamber of the present invention is completely free of any covering or encumbrance. In another embodiment, where mechanical integrity of the enclosure is desired (such as in forensic chain of custody use), the end of the sleeve may be fitted with a non-conductive glove such as, for example, a surgical glove, to allow manipulation of the Device Under Test while still maintaining the benefits of the sleeved arm shielding effect. In this example, the glove does not perform a shielding function, its only use it to seal the enclosure mechanically.

Preferably, at least one shielded window is provided in the enclosure to permit observation of the device during testing. In addition, a light may be provided within the enclosure. Shielded or RF filtered I/O (input/output) connectors may be provided as needed through the enclosure to permit connection of a Device Under Test to, for example, external power sources, computers, measurement equipment, external antennas, or the like. In one embodiment, such I/O connectors use a standard sized rectangular hole through the enclosure, along with a matching metallic plate containing various I/O connectors, that is securely and conductively attached using a plurality of fasteners, allowing for the easy interchange of various plates and their associated I/O connectors.

Turning now to FIG. 1, a closed perspective view of the Electromagnetic Isolation Chamber With Unimpeded Hand Entry 100 is depicted. The chamber is illustrated in the figures by way of example as having a generally rectangular enclosure, but may also have, in some embodiments of the present invention, differing geometries that may better suit specific applications or requirements. In the exemplary embodiment depicted in FIG. 1, the chamber has a base portion 101 and a top portion 103 joined by hardware such as, for example, hinges 119 and latches 117. The base portion 101 and the top portion 103 are made from a conductive material to provide electromagnetic shielding, such as a metal, conductive or metalized plastic, metal-plastic laminate, conductive polymer, metal screening, metal foil, conductive fabric, a combination of materials, or other materials that may afford electromagnetic shielding and provide a faraday cage construct. Typically, with materials such as metal screening, there must exist openings smaller than a fractional wavelength of the radiation to be shielded in order to provide such a faraday cage construct. The use of a hingeably or otherwise connected base portion 101 and top portion 103 permits the opening of the chamber 100 to admit, for example, a device to be tested. The use of hardware such as latches 117 secure the top to the base when the chamber is in the closed position to contain a volume of space electromagnetically isolated from the environment surrounding the chamber 100. The top portion 103 and the base portion 101 are conductively connected. Such conductivity may be by way of mechanical and ohmic contact, such as, for example, a base shielding gasket 121 that spans the periphery of the base portion 101 and may be made from a metal such as, for example, brass, copper, stainless steel, and the like. The gasket may be a braided mesh, spring stock, or the like. Alternatively, or in addition to, the base shielding gasket 121, a gasket may be placed on the top portion 103 to provide for electromagnetic shielding. A gasket, whether top or bottom or both, may also be made integral to the enclosure. In another embodiment of the present invention, the hinges 119 and or the latches 117 provide ohmic as well as mechanical contact between the top portion 103 and the base portion 101. They may further serve to seat or otherwise secure a gasket such as the base shielding gasket 121. Electromagnetic sealing of the top portion 103 and the base portion 101 may also be by way of purely mechanical positioning of the engaging edges of the base portion 101 and the top portion 103. To facilitate operation of a device under test or other apparatus placed within the chamber, apertures 105 are provided through the enclosure, and may be round, square, oval, or other suitable geometry. Attached to the enclosure of FIG. 1 are a first sleeve 107 and a second sleeve 109 which are themselves conductive and, in conjunction with the arms of an operator being inserted into the chamber, provide an RF barrier. The sleeves are attached to the enclosure by way of clamping, pressure or friction fitting, gluing, stitching, or the like. Such attachment mechanically connects one end of a sleeve with the perimeter of each aperture 105 such that the electromagnetic conductivity of the enclosure continues on to the conductive sleeves. Alternatively, when the enclosure needs to be mechanically sealed, such as to fully seal off the internal contents of the enclosure from removal, the sleeve may have the previously open end that is internal to the chamber closed with a non-conductive glove end or similar structure.

The sleeves, when having an operator's arms inserted within, allow direct access to a device under test without breaking the electromagnetic seal of the enclosure. In one embodiment of the present invention, the sleeves are formed from electrically conductive material and are elastic, providing intimate contact with an operator's arms, and by suitable selection of material and size provide for firm contact with the operator's arm over a wide range of physical arm sizes. Sleeves made from other conductive materials may also be used, provided that they allow for a low impedance connection between the arms and the sleeve.

The somewhat "open" appearance of the Electromagnetic Isolation Chamber 100 goes contrary to teachings in the art of RF shielding and enclosures, and indeed the use of an operators arm and hand as part of an electromagnetically enclosed chamber is an unexpected result that has heretofore not been disclosed or suggested.

Alternatively, or in addition to the conductive sleeves, a flexible, conductive shielded sleeve conductively connected around an aperture in a manner similar to that of the aperture and sleeve arrangement previously described, and of any desired size and shape, may be provided for admitting, for example, an electrically conductive tool, or an analytical device, to the interior of the chamber without defeating the electromagnetic isolation of the chamber.

To facilitate viewing and operating a device under test, a window 111 having shielding 113 may be incorporated into the enclosure. The window and shielding may comprise, for example, metal screening with openings that are, for example, about 0.1 inch on a side, and laminated between two sheets of clear acrylic glazing, the screening being conductively attached to top portion 103 around the periphery of the window by way of, for example, a conductive bezel. The shielding 113 may also be, for example, metal mesh, perforated metal sheet, transparent conductive coating, stretched conductive fabric, or the like. The window 111 may be made from glass, acrylic, polycarbonate, or the like. Additionally, in some embodiments of the present invention, two or more layers of shielding may be used, and may, in some embodiments of the present invention, be separated by a suitable dielectric such as glass, acrylic, polycarbonate, the same material used for window 111, or the like. Such a layered structure provides for increased attenuation such as series summation. Suitable shielded windows are disclosed, for example, in U.S. Pat. No. 4,247,734 to Johnson et al.; U.S. Pat. No. 4,884,171 to Maserang et al.; U.S. Pat. No. 5,012,041 to Sims et al.; U.S. Pat. No. 5,017,419 to Smith; and U.S. Pat. No. 5,373,102 to Ehrlich et al.

In some embodiments of the present invention, an I/O connector plate 115 containing I/O (input/output) connectors may be provided to allow for connection of a device under test within the chamber to the outside world. The I/O connector plate 115 being conductively attached to an opening in the chamber by way of fasteners, such as a plurality of screws, allowing for the easy interchange of various plates with various connectors installed on each plate. The plate may also be blank (no connectors) or contain other mechanical or electrical devices, such as, for example, switches, to accommodate a wide variety of applications for the chamber 100.

Some embodiments of the present invention may have a handle 123 or a pair of handles, or several handles, to provide for ease of movement and lifting of the chamber 100.

Figure 2:
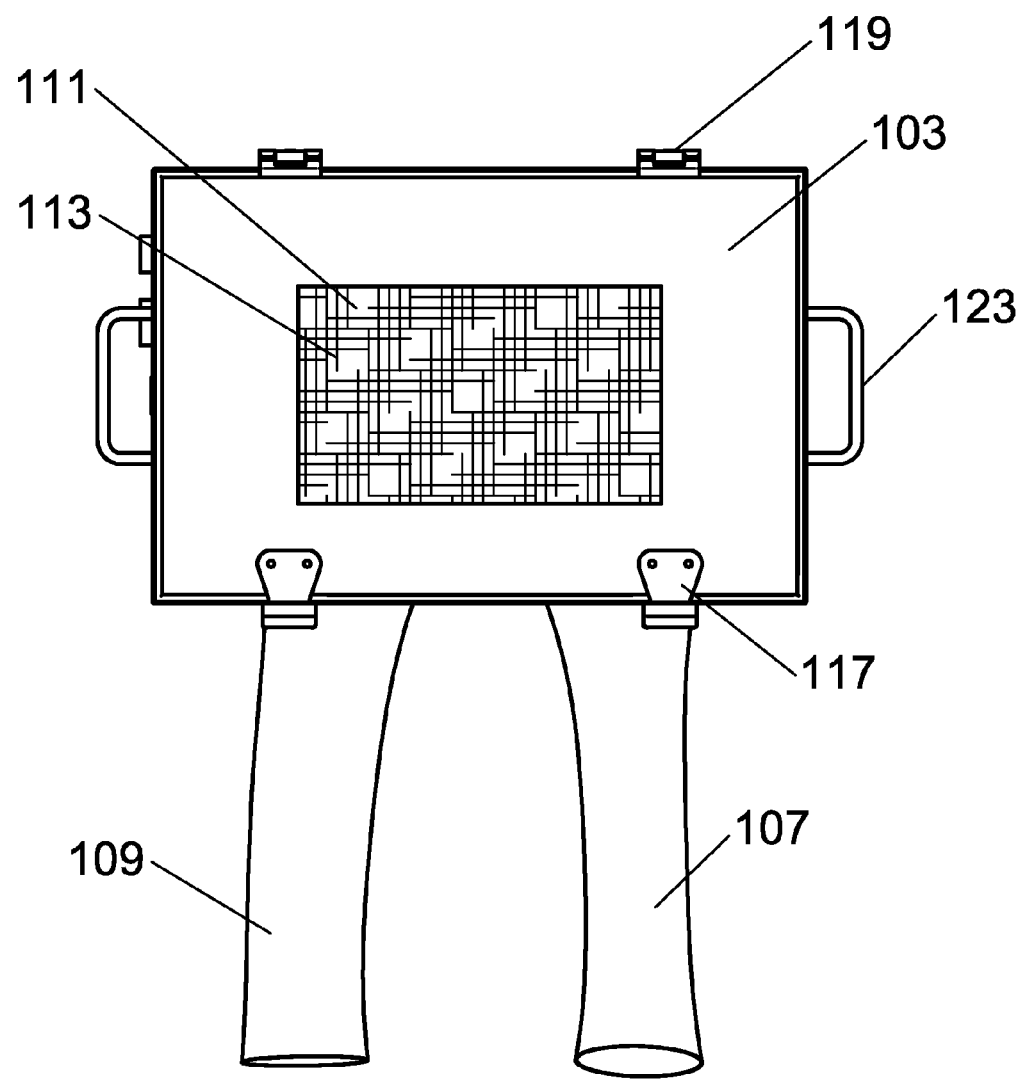
FIG. 2 is a closed top plan view of the Electromagnetic Isolation Chamber With Unimpeded Hand Entry.

Now turning to FIG. 2, a closed top plan view of the Electromagnetic Isolation Chamber With Unimpeded Hand Entry is depicted.

Figure 3:
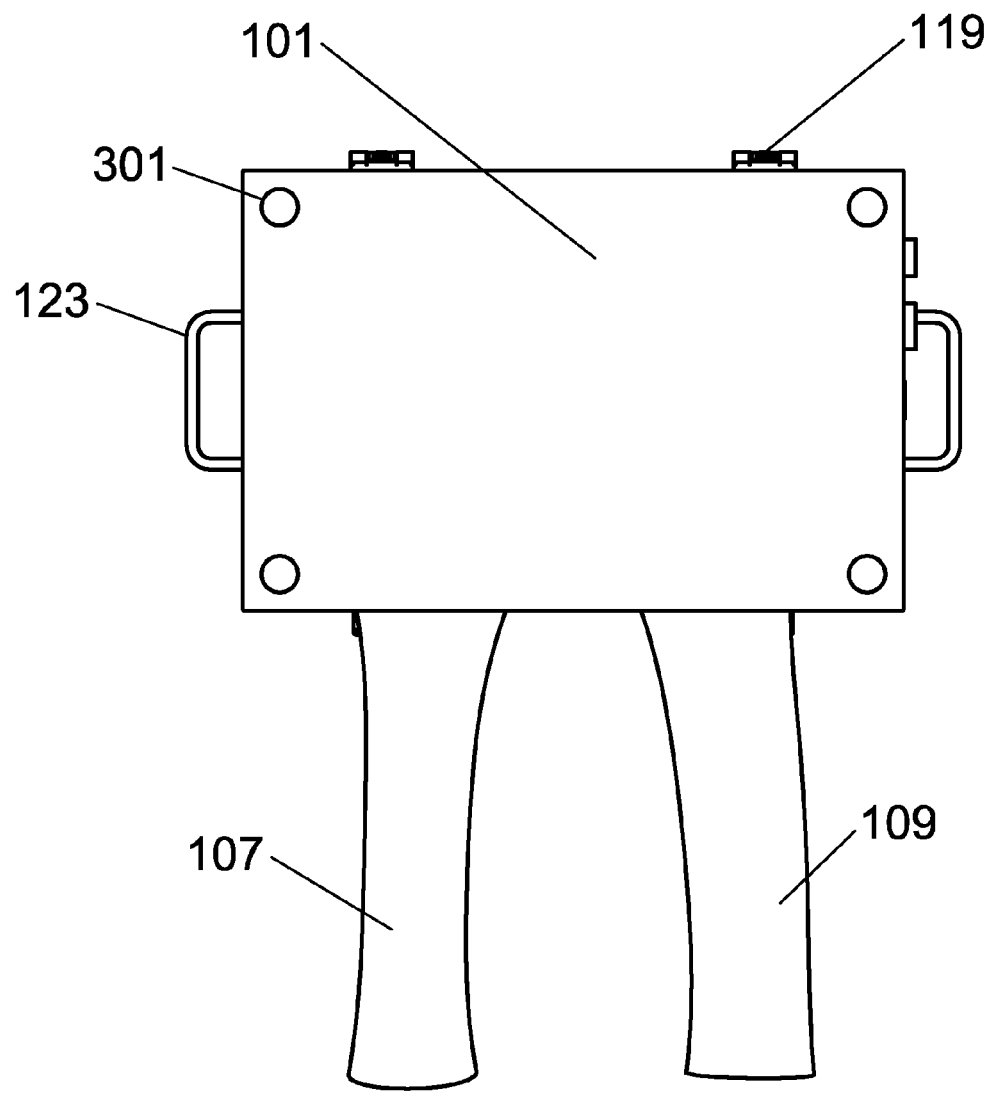
FIG. 3 is a closed bottom plan view of the Electromagnetic Isolation Chamber With Unimpeded Hand Entry.

FIG. 3 depicts a closed bottom plan view of the Electromagnetic Isolation Chamber With Unimpeded Hand Entry. In FIG. 3, base hardware 301 is depicted. Base hardware may be, for example, slip resistant feet or tabs, or may also be mounting hardware to prevent the chamber from moving while in use or to make for more permanent installation of the chamber.

Figure 4:
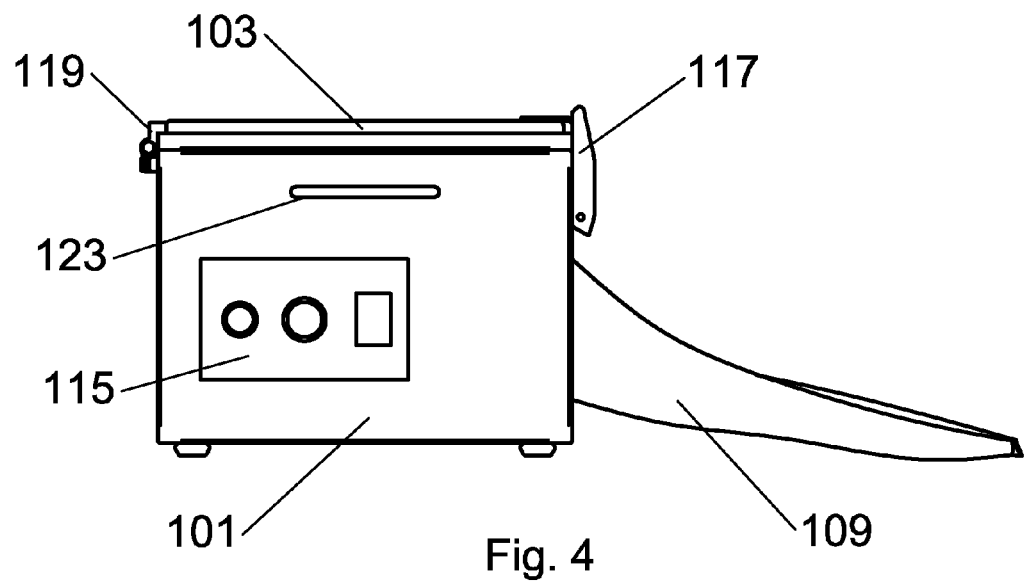
FIG. 4 is a closed left side view of the Electromagnetic Isolation Chamber With Unimpeded Hand Entry.
Figure 5:
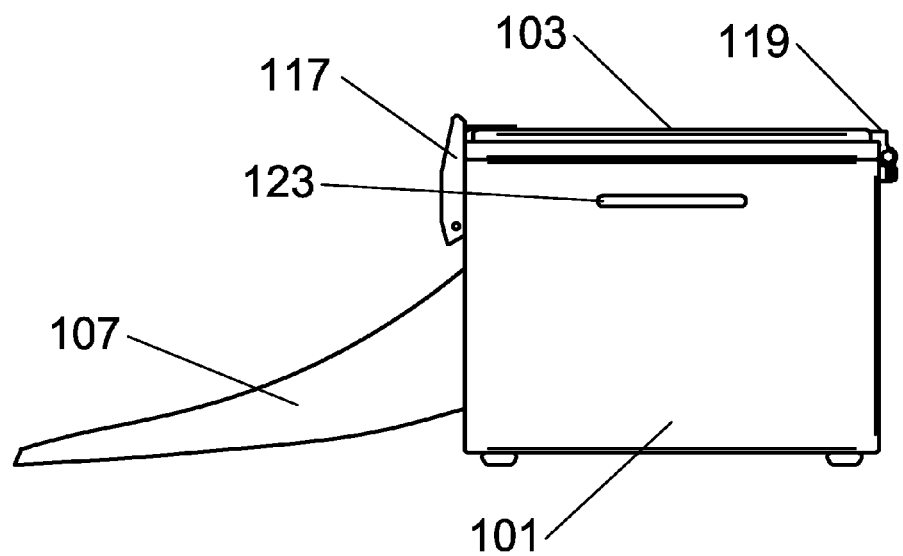
FIG. 5 is a closed right side view of the Electromagnetic Isolation Chamber With Unimpeded Hand Entry.

FIG. 4 is a closed left side view of the Electromagnetic Isolation Chamber With Unimpeded Hand Entry and FIG. 5 is a closed right side view of the Electromagnetic Isolation Chamber With Unimpeded Hand Entry.

Figure 6:
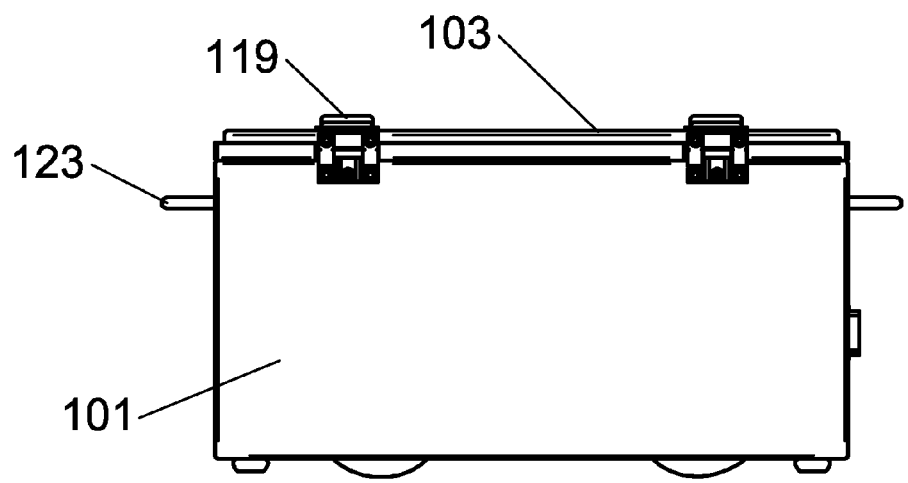
FIG. 6 is a closed rear view of the Electromagnetic Isolation Chamber With Unimpeded Hand Entry.
Figure 7:
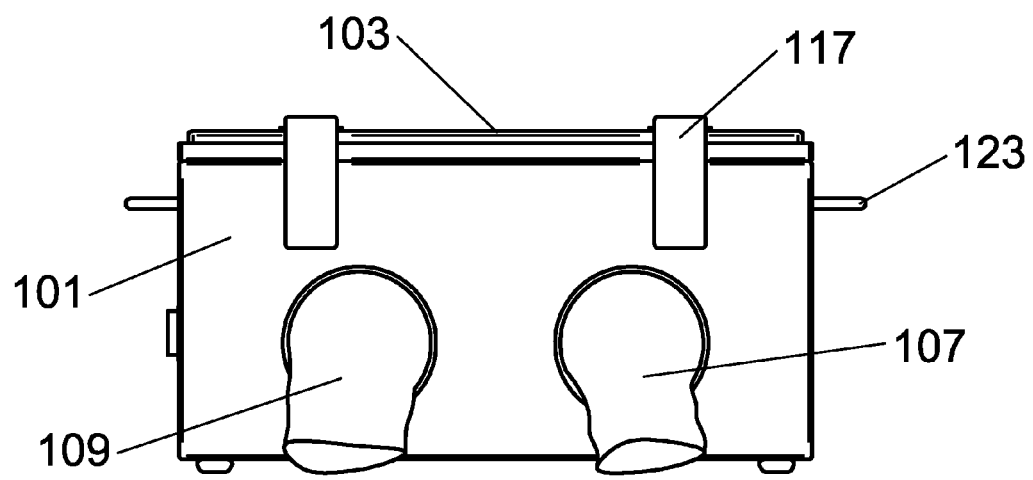
FIG. 7 is a closed front view of the Electromagnetic Isolation Chamber With Unimpeded Hand Entry.

FIG. 6 is a closed rear view of the Electromagnetic Isolation Chamber With Unimpeded Hand Entry and FIG. 7 is a closed front view of the Electromagnetic Isolation Chamber With Unimpeded Hand Entry.

Figure 8:
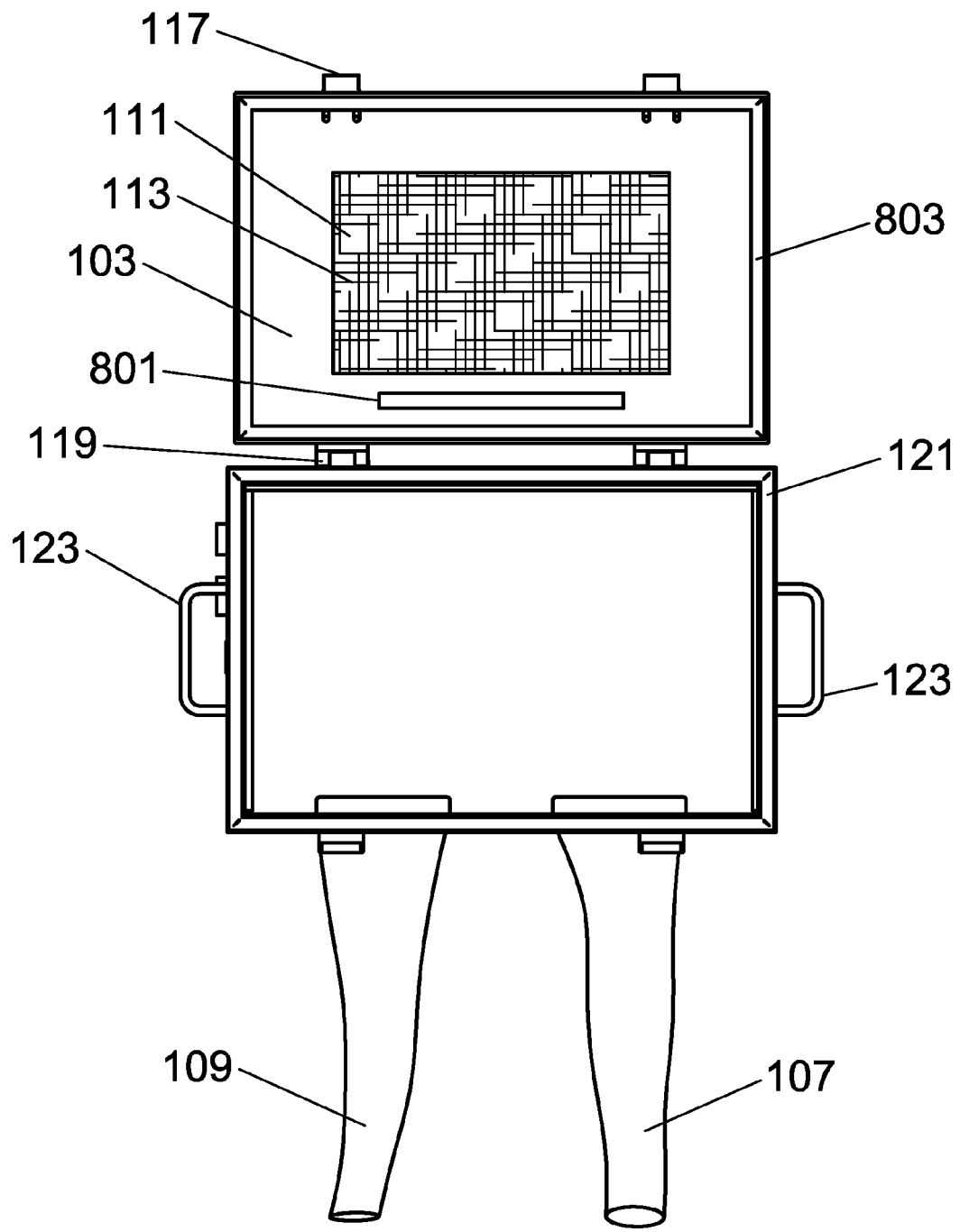
FIG. 8 is an open top plan view of the Electromagnetic Isolation Chamber With Unimpeded Hand Entry.

FIG. 8 is an open top plan view of the Electromagnetic Isolation Chamber With Unimpeded Hand Entry. To facilitate an operator working with and viewing a device under test within the chamber 100, the top portion may be provided with a light 801 within the chamber. The light 801 may also be placed in the base portion or such other location that may provide illumination within the chamber. The interior of the chamber may also, in some embodiments of the present invention, be lined or covered with a material such as an RF absorption material to reduce RF reflections within the chamber, an anti-static material, or the like.

Figure 9:
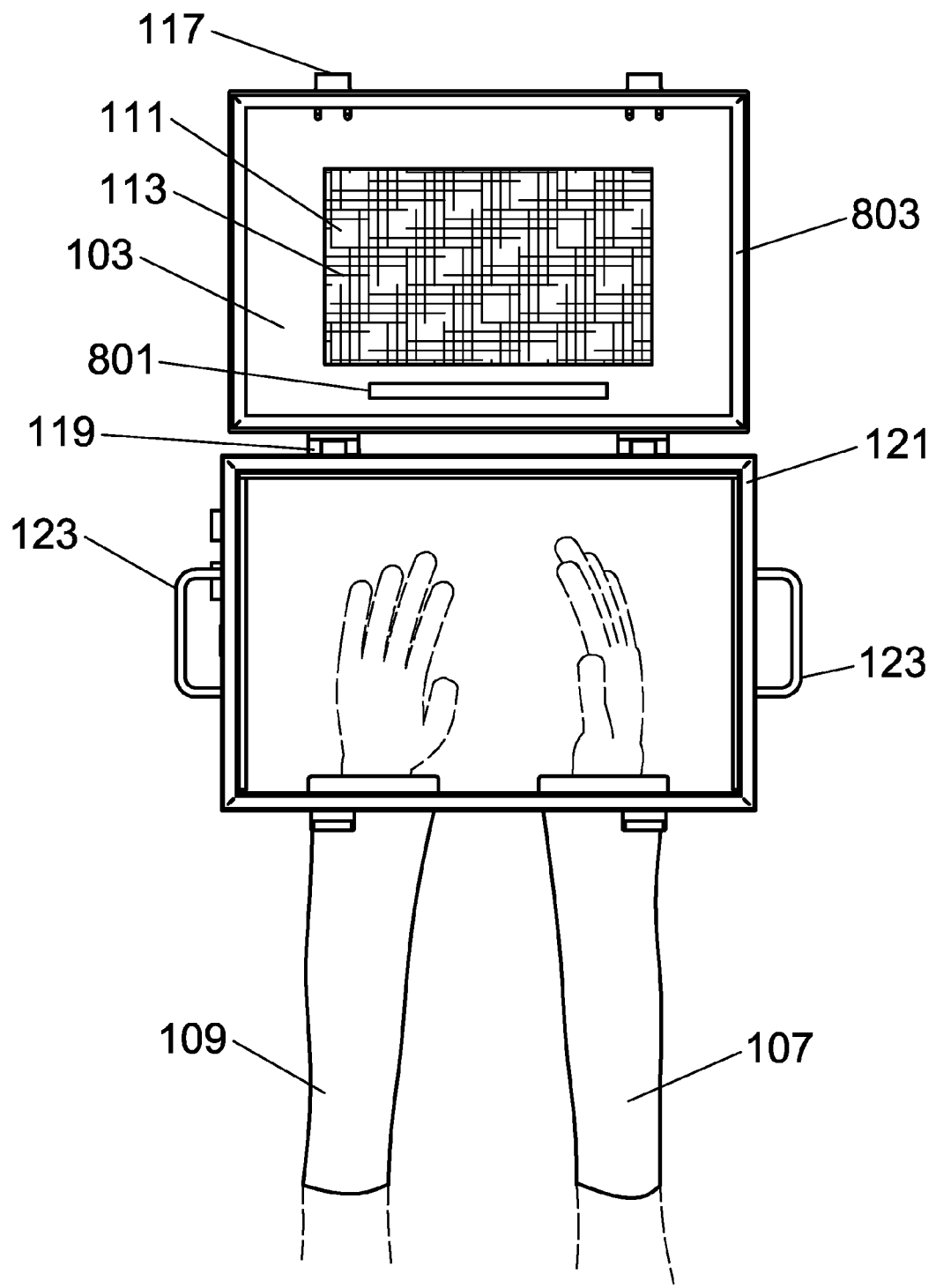
FIG. 9 is an open top plan view of the Electromagnetic Isolation Chamber With Unimpeded Hand Entry in use.

FIG. 9 is an open top plan view of the Electromagnetic Isolation Chamber With Unimpeded Hand Entry in use. An operator's hands are shown in dotted line rendering extending through sleeves 107 and 109. The operator's hands being important for the completion of the electromagnetic shielding environment.

Figure 10:
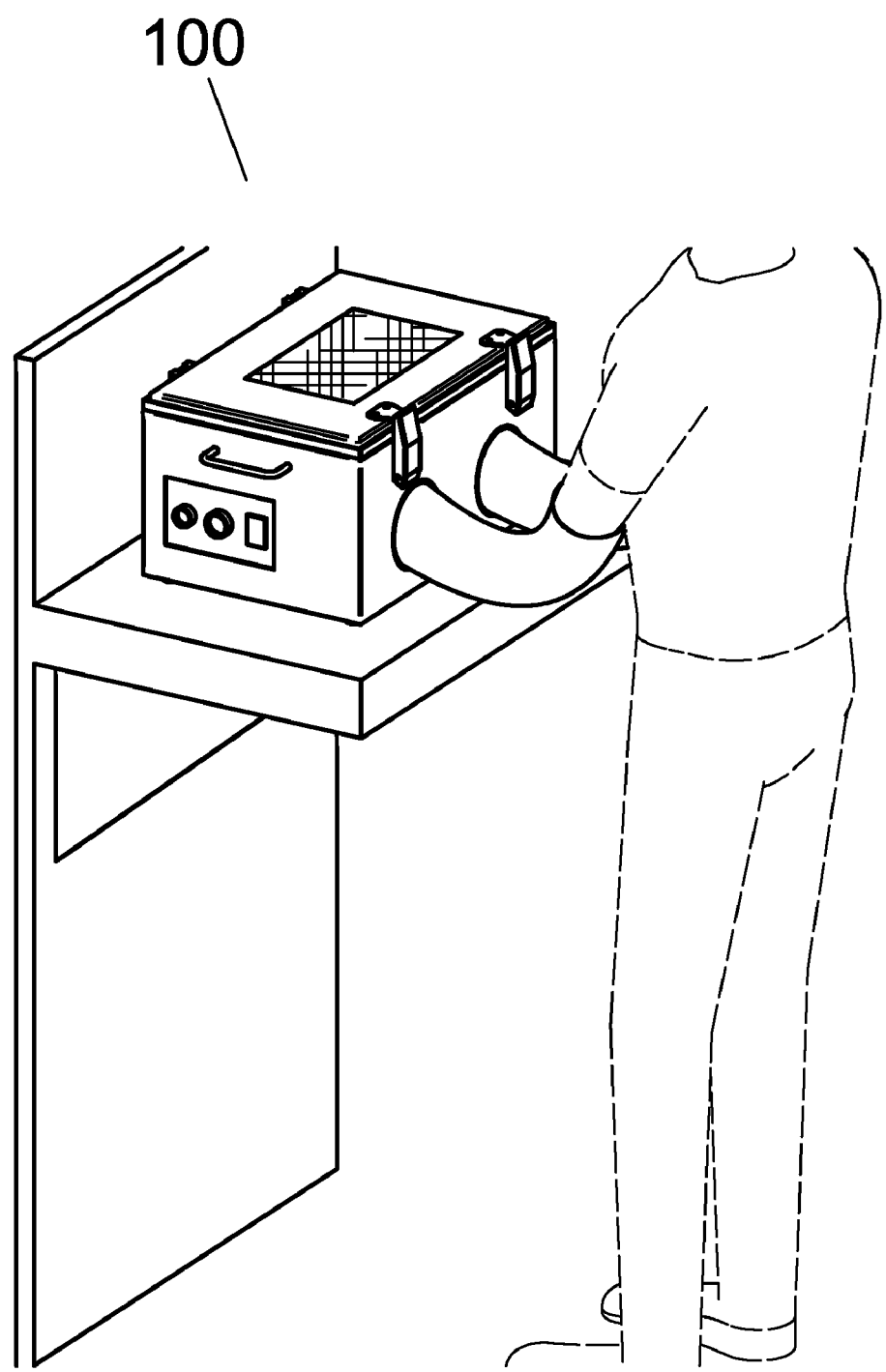
FIG. 10 shows the Electromagnetic Isolation Chamber With Unimpeded Hand Entry in use at a lab bench.

FIG. 10 shows the Electromagnetic Isolation Chamber With Unimpeded Hand Entry in use at a lab bench. As can be seen in the drawing, an operator's hands extend through the conductive sleeves and into the chamber. The conductive sleeves are worn partway up the operator's arms to complete the faraday cage effect of the chamber.

It is, therefore, apparent that there has been provided, in accordance with the various objects of the present invention, an Electromagnetic Isolation Chamber With Unimpeded Hand Entry. While the various objects of this invention have been described in conjunction with preferred embodiments thereof, it is evident that many alternatives, modifications, and variations will be apparent to those skilled in the art. Accordingly, it is intended to embrace all such alternatives, modifications and variations that fall within the spirit and broad scope of this specification, drawings and claims herein.

What is claimed is:

1. An electromagnetic isolation chamber with unimpeded hand entry containing a volume of space electromagnetically isolated from the surrounding environment, comprising:

an enclosure surrounding said volume, said enclosure comprising electromagnetic shielding surrounding said volume and having an aperture there through; and a conductive sleeve conductively open on both ends and conductively and shieldingly attached to said electromagnetic shielding and extending from said aperture, the majority of said conductive sleeve being elastic and formed from an electrically conductive material and deformable and of sufficient diameter to enclose and provide intimate contact with an operator's arm which may be inserted into said electromagnetic isolation chamber through said conductive sleeve and aperture so that continuity of electromagnetic isolation of said volume of space is maintained while the operator's arm is inserted through said sleeve.

2. A chamber in accordance with claim 1 wherein said electromagnetic shielding comprises a metal.

3. A chamber in accordance with claim 1 wherein said electromagnetic shielding comprises a conductive fabric.

4. A chamber in accordance with claim 1 wherein said electromagnetic shielding comprises a metal screening.

5. A chamber in accordance with claim 1 wherein said electromagnetic shielding comprises a metalized plastic.

6. A chamber in accordance with claim 1 wherein said electromagnetic shielding comprises a conductive polymer.

7. A chamber in accordance with claim 1 wherein said electromagnetic shielding comprises a metal-plastic laminate.

8. A chamber in accordance with claim 1 wherein said enclosure is openable and has a top portion and a base portion.

9. A chamber in accordance with claim 8 wherein said top portion is conductively attached to said base portion.

10. A chamber in accordance with claim 8 wherein said top portion is attached by an attachment which comprises a hinge and a latch.

11. A chamber in accordance with claim 8 further comprising a shielding gasket between said top portion and said base portion.

12. A chamber in accordance with claim 1 further comprising a shielded window in said enclosure.

13. A chamber in accordance with claim 1 further comprising a light within said enclosure.

14. A chamber in accordance with claim 1 further comprising an I/O connector plate removably attached to said enclosure.

15. A conductive sleeve conductively open at both ends, the majority of said conductive sleeve being elastic and formed from an electrically conductive material and deformable and of sufficient diameter to enclose and provide intimate contact with an operator's arm, said conductive sleeve further having a conductive flange electrically and shieldingly attached to one end of said conductive sleeve.

16. The conductive sleeve of claim 15, wherein said conductive sleeve comprises a conductive fabric.

17. A retrofit kit for replacing a second magnetic shielding of U.S. Pat. No. 5,594,200, the retrofit kit comprising a conductive sleeve conductively open at both ends, the majority of said conductive sleeve being elastic and formed from an electrically conductive material and deformable and of sufficient diameter to enclose and provide intimate contact with an operator's arm, said conductive sleeve further having a conductive flange electrically and shieldingly attachable to one end of said conductive sleeve.

18. The retrofit kit of claim 17, wherein said conductive sleeve comprises a conductive fabric.

* * * * *